(12) United States Patent  
Gleissner et al.

(10) Patent No.: US 12,261,075 B2  
(45) Date of Patent: Mar. 25, 2025

(54) SUBSTRATE HANDLING DEVICE FOR A WAFER

(71) Applicant: SEMSYSCO GMBH, Salzburg (AT)

(72) Inventors: Andreas Gleissner, Döbriach (AT); Manuel Eibl, Krispl (AT); Herbert Oetzlinger, Hallwang (AT)

(73) Assignee: SEMSYSCO GMBH, Salzburg (AT)

( * ) Notice: Subject to any disclaimer, the term of this patent is extended or adjusted under 35 U.S.C. 154(b) by 0 days.

(21) Appl. No.: 17/630,642

(22) PCT Filed: Jul. 30, 2020

(86) PCT No.: PCT/EP2020/071516  
§ 371 (c)(1),  
(2) Date: Jan. 27, 2022

(87) PCT Pub. No.: WO2021/019018  
PCT Pub. Date: Feb. 4, 2021

(65) Prior Publication Data  
US 2022/0262668 A1 Aug. 18, 2022

(30) Foreign Application Priority Data  
Jul. 30, 2019 (EP) ..................................... 19189179

(51) Int. Cl.  
*H01L 21/683* (2006.01)  
*H01L 21/67* (2006.01)  
*H01L 21/677* (2006.01)

(52) U.S. Cl.  
CPC .... *H01L 21/6838* (2013.01); *H01L 21/67288* (2013.01); *H01L 21/67742* (2013.01)

(58) Field of Classification Search  
CPC ......... H01L 21/16838; H01L 21/68707; H01L 21/6838; H01L 21/67288; H01L 21/67092;  
(Continued)

(56) References Cited

U.S. PATENT DOCUMENTS 2,198,765 A * 4/1940 Featherstone ......... B25B 11/005  
269/21  
5,937,993 A * 8/1999 Sheets ................... B25B 11/005  
269/21  
(Continued)

FOREIGN PATENT DOCUMENTS

AT 398416 B * 10/1994 ............. B65G 47/91  
DE 19833311 A1 * 1/2000 ............. B65G 15/58  
(Continued)

OTHER PUBLICATIONS

Apparatus for Transfer Substrates; Date Published: Sep. 11, 2009; Date Filed: Jan. 19, 2007 (Year: 2009).*

(Continued)

*Primary Examiner* — Mahdi H Nejad  
(74) *Attorney, Agent, or Firm* — Meunier Carlin & Curfman LLC

(57) ABSTRACT

The invention relates to a substrate handling device for a wafer, a substrate handling system for a wafer and a method for substrate handling. The substrate handling device comprises: —an end effector, —a straightening ring, and —a suction cup. The suction cup is arranged within the straightening ring. At least the straightening ring is releasably attached to the end effector. A first part of the suction cup is connectable to a vacuum supply and a second part of the suction cup is attachable to a substrate by means of reduced pressure provided by the vacuum supply. The suction cup projects from the straightening ring in a normal pressure state. The suction cup is on the same level as the straightening ring in a reduced pressure state, in which the substrate is held by the suction cup, so that the straightening ring contacts the substrate.

14 Claims, 1 Drawing Sheet

(58) Field of Classification Search
CPC . B25J 11/0095; B25J 15/0683; B25B 11/005; B65G 47/91; Y10T 279/11
USPC ............ 269/21, 303, 305; 414/752.1; 279/3
See application file for complete search history.

(56) References Cited

U.S. PATENT DOCUMENTS

| | | | |
|---|---|---|---|
| 6,517,130 B1* | 2/2003 | Donoso | H01L 21/6838 414/737 |
| 8,613,474 B2* | 12/2013 | Goodman | H01L 21/68785 294/64.3 |
| 10,259,124 B2 | 4/2019 | Bogner | |
| 10,615,068 B2* | 4/2020 | Coady | H01L 21/68 |
| 11,779,940 B1* | 10/2023 | Kwon | H01L 21/67288 239/11 |
| 2012/0107081 A1* | 5/2012 | Furuta | H01L 21/67742 414/751.1 |
| 2018/0284071 A1* | 10/2018 | Wright | G01N 29/223 |
| 2018/0350652 A1 | 12/2018 | Matsuhira | |

FOREIGN PATENT DOCUMENTS

| | | | |
|---|---|---|---|
| DE | 19924810 A1 * | 9/2000 | ............ B65G 15/42 |
| EP | 1038805 A1 * | 9/2000 | ............ B65G 15/58 |
| EP | 1110882 A1 * | 6/2001 | ......... B65G 21/2036 |
| JP | 2012146783 A * | 8/2012 | |
| WO | 2015/134258 | 9/2015 | |

OTHER PUBLICATIONS

Double-face Glass Scrubber; Document ID: CN 2388911 Y; Date Published: Jul. 26, 2000; Inventor: Wang, Yue-min; Date Filed: Sep. 20, 1999 (Year: 2000).*

Conveyor Belt for Metal Sheets and Blanks Has Device to Curve Belt to Move Suction Cups Between Active and Protected Positions; Document ID: DE 19833311 A1; Inventor: Vogel N; Date Published: Jan. 13, 2000; Date Filed: Jul. 24, 1998 (Year: 2000).*

Suction-operated Conveyer Belt; Document ID: DE 19924810 A1; Inventor: Kulik Gerhard, Ulrich Hans, Langenberg Helmut; Date Published: Sep. 28, 2000; Date Filed: May 29, 1999 (Year: 2000).*

International Search Report and Written Opinion dated Oct. 16, 2020, from International Application No. PCT/EP2020/071516, 10 pages.

Written Opinion issued for Singaporean Application No. 11202111080U, dated Dec. 19, 2022.

Extended European Search Report in Application No. 19189179.5, dated Jan. 31, 2020, 8 pages.

Office Action in European Application No. 19189179.5, dated Nov. 25, 2020, 5 pages.

Intention to Grant in European Application No. 19189179.5, dated Feb. 22, 2021, 25 pages.

Decision to Grant in European Application No. 19189179.5, dated Apr. 30, 2021, 2 pages.

* cited by examiner

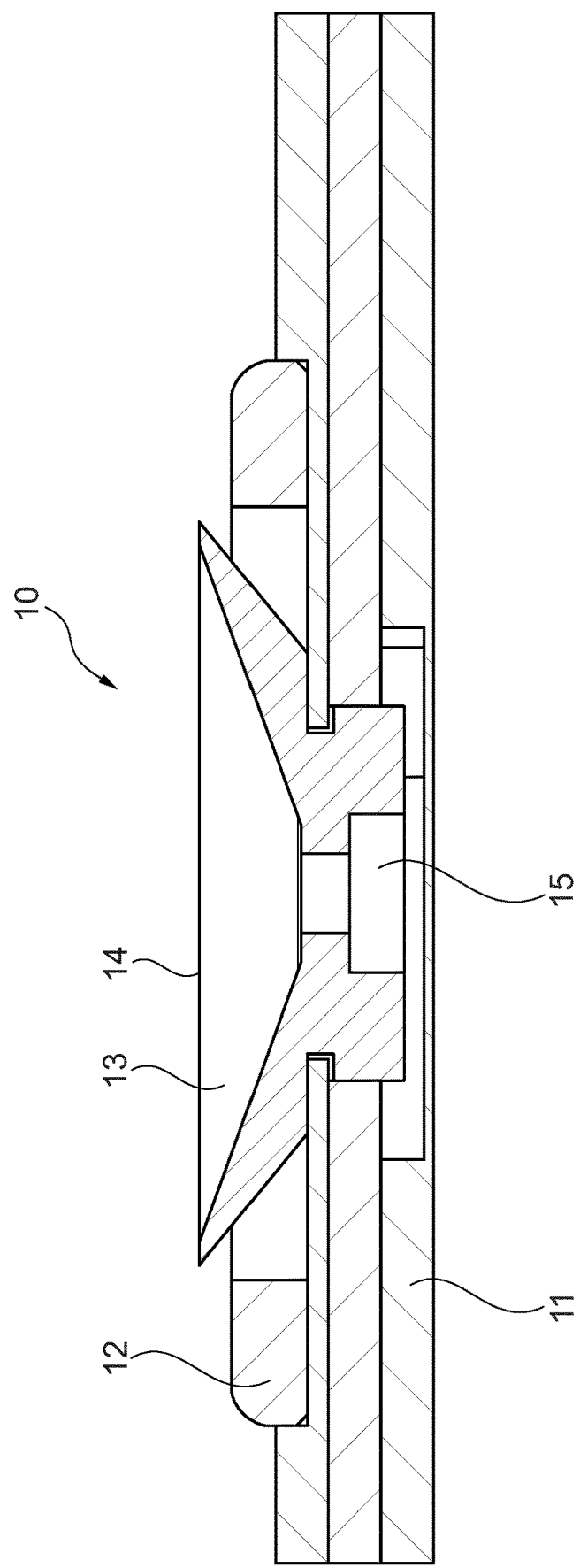

SUBSTRATE HANDLING DEVICE FOR A WAFER

FIELD OF THE INVENTION

The invention relates to a substrate handling device for a wafer, a substrate handling system for a wafer and a method for substrate handling. The invention relates in particular to single wafer handling for thin substrates. Thin substrates mean substrates from several hundreds to below 100 micrometers.

BACKGROUND OF THE INVENTION

Wafer processing and in general substrate processing in semiconductor and adjacent industries (packaging, solar panels, etc.) requires very often a reliable handling of thin substrates. Reliable means for picking up, placing or replacing the substrates in a vertical or horizontal position from a storage cassette or a robot handling in a process tool without scratching, breaking, strongly bending or even cracking the substrate. Thin substrates mean substrates from a couple of hundred to sometimes far below 100 micrometer.

The effect of being thin causes these substrates to very often being very fragile and already bent, so not to form or display a planar substrate when being held without support structure. This natural occurrence of bending of the substrates, caused through stress in the material or just gravitational forces, is a major concern when trying to handle thin wafers, especially, when trying to handle thin substrates with a handling tool, which holds the substrate in place by means of applying a certain amount of vacuum on one or multiple places of the substrate.

When applying vacuum strong enough for a substrate not to fall off a moving handling device, it occurs in currently existing systems that the substrate is deformed through the vacuum forces additionally to the already existing deformations. This additional deformation leads in many cases to the fact that vacuum suction is lost, and the substrate falls off from the handling device, or in certain cases, cracks and breaks due to the additional deformation at locations, where vacuum force is being applied.

WO 2015/134258 A1 discloses wafer-handling end effectors and semiconductor manufacturing devices that include and/or are utilized with wafer-handling end effectors. The end effectors include an end effector body and a plurality of wafer-contacting surfaces that are supported by the end effector body and configured to form an at least partially face-to-face contact with a wafer. The end effectors further include a vacuum distribution manifold that extends between a robot-proximal end of the end effector body and the plurality of wafer-contacting surfaces. The end effectors also include a plurality of vacuum openings that are defined within the plurality of wafer-contacting surfaces and extend between the plurality of wafer-contacting surfaces and the vacuum distribution manifold. The end effectors further include a plurality of sealing structures each of which are associated with a respective one of the pluralities of wafer-contacting surfaces.

When a thin, already bent substrate is contacted by e.g. the end-effector of WO 2015/134258 A1, the substrate remains bent or bends even more, because the gasket is adjusting its deformation to the given bending state of the substrate. This deformation leads to the fact that vacuum suction is lost, the substrate falls off from the handling device and/or cracks.

Further, there is a significant delay of releasing a wafer from such vacuum holding system when the vacuum is turned off. As the substrate is in close contact with a wafer-contacting surface integrating a source of vacuum, it takes in-between hundreds of microseconds to a couple of seconds before the vacuum is weak enough to release the wafer. This releasing delay leads to significant processing and manufacturing delays in large manufacturing operations where hundreds of thousands of wafers handled every day.

SUMMARY OF THE INVENTION

Hence, there may be a need to provide an improved substrate handling device, which allows a better handling of, in particular, thin substrates.

The problem of the present invention is solved by the subject-matters of the independent claims, wherein further embodiments are incorporated in the dependent claims. It should be noted that the aspects of the invention described in the following apply also to the substrate handling device for a wafer, the substrate handling system for a wafer and the method for substrate handling.

According to the present invention, a substrate handling device for a wafer is presented. The substrate handling device comprises:
an end effector,
a straightening ring, and
a suction cup.

The suction cup is arranged within the straightening ring. A first part of the suction cup is connectable via the end effector to a vacuum supply and a second part of the suction cup is attachable to a substrate by means of reduced pressure provided by the vacuum supply. The suction cup projects from the straightening ring in a normal pressure state. The suction cup is on the same level as the straightening ring in a reduced pressure state, in which the substrate is held by the suction cup, so that the straightening ring contacts the substrate.

The substrate handling device is configured to handle a substrate. The substrate to be handled may be a wafer. The substrate may be thin or ultra-thin, which should be understood as a substrate with a thickness from several hundreds to below 100 micrometers, preferably 10 to 750 μm, and more preferably 20 to 100 μm. Substrates with such a thickness are often very fragile and already initially bent, may be due to gravitational forces, stress within the material or the like. This means, thin substrates often do not have or form a planar surface when being held without support.

The suction cup is arranged within the straightening ring. The suction cup may be arranged in a center of the straightening ring. The straightening ring may surround the suction cup. The straightening ring thereby restricts the suction cup. It limits or prevents a (radial) deformation of the suction cup and does not allow the suction cup to deform in accordance with a given bending state of the substrate. As a result, the vacuum suction does not get lost also in case of thin and often non-planar substrates and such substrates are neither cracked nor lost.

The straightening ring may be releasably attached to the end effector. The straightening ring may be removably or exchangeable connected to the end effector. In other words, the straightening ring may not be part, not integrated in, not integral with the end effector. The straightening ring may not be fixedly or permanently connected to the end effector but can be exchanged or replaced by another straightening ring, which is newer or has other properties, shapes or sizes. In addition or alternatively, the suction cup may be releasably attached to the end effector.

In an embodiment, the straightening ring may be connected to the end effector directly or indirectly via a supporting element arranged between the end effector and the straightening ring. The straightening ring may provide a form fit, a force fit or a threaded connection when mounted to the end effector or the supporting element, such that the straightening ring may be easily released, exchanged or replaced.

In an embodiment, the suction cup may be connected to the end effector directly or indirectly via a supporting element arranged between the end effector and the straightening ring. The suction cup may be connected to the end effector independently of the straightening ring, thus a disassembly of the straightening ring may not affect the suction cup. The suction cup may provide a form fit, a force fit or a threaded connection when mounted to the end effector or the supporting element, such that the suction cup may be easily released, exchanged or replaced.

During operation of the substrate handling device, the first part of the suction cup is connected to the vacuum supply and the second part of the suction cup is sucked to the substrate or wafer.

In a normal pressure state or ambient pressure, the suction cup projects from the straightening ring. In particular, a substrate-contacting surface of the suction cup may project from the straightening ring. In other words, an outer edge of the suction cup may initially extend a certain distance further away from the end effector body compared to the straightening ring.

In a reduced pressure state provided by the vacuum supply, the suction cup is on the same level as the straightening ring. In other words, the outer edge of the suction cup may reach the same height as the straightening ring. In the reduced pressure state, the straightening ring may contact the substrate, reduced pressure or vacuum may be applied to a substrate surface, and the suction cup may hold the substrate in place. The straightening ring provides a certain contact area with the substrate (a certain areal profile) and thereby provides means for straightening also a bend and/or otherwise deformed substrate. As a result, a curvature of the substrate induced by the reduced pressure or vacuum and, if applicable, also an initial or pre-existing curvature of the substrate can be significantly reduced.

The substrate handling device for a wafer according to the present invention thereby allows a better handling of thin substrates. It significantly improves performance and functionality of fragile substrate handling. The disk-shaped straightening ring is arranged around the suction cup acting as vacuum suction gasket. The straightening ring thereby limits or prevents a (radial) deformation of the suction cup and does not allow the suction cup to deform in accordance with a given bending state of the substrate. As a result, the vacuum suction does not get lost also in case of thin and often non-planar substrates and such substrates are neither cracked nor lost. Thereby, a secure movement of thin and/or bend substrates in and out of very small gaps with dimensions close to the substrate thickness (like transport cassettes or a specific processing chambers or equipment or the like) is made possible. In other words, thin and even warped, bent, bowed and/or otherwise non-planar wafers/substrates can be handled, retained, transferred and/or the like. Such substrates can be straightened or flattened while handling to allow a movement also under reduced space requirements.

In an embodiment, a protrusion rate or releasing speed of the suction cup from the straightening ring may be adjustable by controlling the pressure or vacuum applied in the suction cup in order to release the substrate from the suction cup in a controlled manner. The reduced pressure or vacuum may therefore be gradually turned off or reduced. As a result, the substrate may be released at a predetermined point of time. The release of the suction cup and thereby of the substrate from the straightening ring can be done with all speeds from immediate to relatively slow. It can be an ejecting or it can be done carefully and smooth. In some cases, the main advantage can be that the release of the substrate can be achieved with zero uncontrolled delay. There may also be an intentional delay in releasing the substrate of microseconds to seconds before the reduced pressure or vacuum is purposely weakened enough to release the substrate. At the time the substrate is again released, the reduced pressure or vacuum might be turned off or gradually reduced. As a consequence, the suction cup elevates, moves, expands back to its initial position and again extends a distance further away from the end effector body compared to the straightening ring. As a result, the substrate is pushed away from the straightening ring and can be released from the suction cup at a predetermined moment without any difficulties or releasing delay. In other words, the release of the substrate is instantaneous at the moment determined as required. Thereby, substrate handling and substrate handling time is significantly improved and the risks of wafer breakage through delayed substrate release are significantly eliminated.

In an embodiment, the straightening ring at least partially straightens a non-planar substrate when the straightening ring contacts the substrate and the substrate is non-planar. The straightening ring may not only contact the substrate, but also carefully enforce a straightening of an already initially bent or curved substrate. The straightening may depend on a strength of the vacuum and/or the size and/or the shape of the straightening ring. In other words, the straightening effect on a bent substrate can be adjusted through the strength of the applied vacuum or reduced pressure and/or the size and/or the shape of the straightening ring. In an embodiment, the suction cup may be retracted along with the strength of the applied vacuum or reduced pressure. Accordingly, flattening a bent substrate may be facilitated without damaging the (ultra-) thin substrate.

The substrate may comprise a conductor plate, a semiconductor substrate, a film substrate, an essentially plate-shaped, metal or metallized workpiece or the like. Vacuum or reduced pressure may be supplied through the suction cup to the substrate and preferably to a back side of the substrate. The back side of the substrate is the side of the substrate, if applicable, which is provided with no or lesser structures, as e.g. electronic components. However, also a front side of the substrate can be contacted, which is the side with (more) structures or electronic components. The structures or electronic components might be protected from contact damage by e.g. a passivation layer deposited on top of the structures or electronic components. A vacuum outlet may be located below and preferably with a distance to the straightening ring.

The end effector may comprise a plurality of substrate handling surface contacts and utilize vacuum or reduced pressure to retain the substrate or wafer on the end effector. The strength of the applied vacuum or reduced pressure can be adjustable to requirements of different substrates and their bending profiles. Also, the shapes, dimensions and the material of the straightening ring can be adjustable to requirements of different substrates and their bending profiles. The same applies for the suction cup.

The suction cup may be elastic, soft and/or flexible. It may be made of an elastic, soft and/or flexible material. It may be made of a material not contaminating the substrate. The suction cup may be made of silicone.

The straightening ring or disk can be carried out in a ring shape or a non-ring shape, it may be circular, oval or square or any other shape which might provide for a beneficial effect. The straightening ring may be stiff, hard and/or rigid. In an embodiment, the straightening ring is made of a material, which is more rigid than a material of the suction cup. The straightening ring may be made of ceramic, as e.g. SiC, or plastic, as e.g. PEEK.

In an embodiment, the substrate handling device further comprises a plurality of suction cups. Preferably, the substrate handling device comprises two to twenty and more preferably two, three or four suction cups.

In an embodiment, the substrate handling device further comprises a plurality of straightening rings each surrounding one of suction cups. Preferably, the substrate handling device comprises two to twenty and more preferably two, three or four straightening rings each surrounding one of suction cups. The substrate handling device preferably comprises the same amount of suction cups and straightening rings.

In an embodiment, the suction cup can hold the substrate in the reduced pressure state in all positions or in several selected positions or in arbitrary positions relative to the ground. Preferably, the substrate handling device and the suction cup can hold the substrate in the reduced pressure state in essentially horizontal or vertical positions. When substrate and substrate handling device are positioned in a horizontally extending direction, the substrate may be placed or lied on top of the suction cup of the substrate handling device. The substrate may also be mounted below the suction cup, when the handling device is turned upside down to pick up the substrate from a place, where the substrate had been placed before. When substrate and substrate handling device are positioned in a vertically extending direction, e.g. inside a storage or transport cassette, the substrate may be placed or put parallel and vertically extending next to the suction cup. Because of the reduced pressure or vacuum, the suction cup may attach to the substrate in a horizontal or a vertical position and pull the substrate closer until the substrate touches the straightening ring.

In an embodiment, an outer circumference of the straightening ring is larger than an outer circumference of the suction cup. This can be understood in that the straightening ring may radially extend over the suction cup.

In an embodiment, in the normal pressure state, the suction cup projects with a distance from the straightening ring. The distance to size of the substrate ratio may be in the range of 30:1 to 800:1 and preferably 100:1 to 600:1. In other words, in the normal pressure state, the suction cup may axially extend over the straightening ring. In contrast, in the reduced pressure state, the suction cup may be on the same level as the straightening ring.

According to the present invention, also a substrate handling system for a wafer is presented. The substrate handling system comprises a substrate handling device as described herein and a vacuum supply. The vacuum supply is connected to a first part of a suction cup of the substrate handling device.

In an embodiment, the substrate handling system further comprises at least one replacing straightening ring to replace a straightening ring of the substrate handling device.

According to the present invention, also a method for substrate handling is presented. The method for or substrate handling comprises the following steps, not necessarily in this order:
a) Providing a suction cup arranged within a straightening ring.
At least the straightening ring is releasably attached to an end effector. A first part of the suction cup is connected via the end effector to a vacuum supply. The suction cup projects from the straightening ring in a normal pressure state.
b) Providing contact between a second part of the suction cup and a substrate.
c) Providing a reduced pressure state by means of the vacuum supply so that the substrate is held by the suction cup.
The suction cup is in the reduced pressure state on the same level as the straightening ring, so that the straightening ring contacts the substrate.

The straightening ring contacts the substrate in the reduced pressure state and may, in case the substrate is non-planar, at least partially straighten the substrate.

Devices, systems and methods are suitable, in particular, for the processing of structured semi-conductor substrates, conductor plates, and film substrates, but also for processing of the entire surface of planar metal and metallized substrates. Devices, systems and methods may also be used according to the invention for the production of large surface photoelectric panels for solar energy generation, or large-scale monitor panels.

It shall be understood that the system, the device, and the method for substrate handling for a wafer according to the independent claims have similar and/or identical preferred embodiments, in particular, as defined in the dependent claims. It shall be understood further that a preferred embodiment of the invention can also be any combination of the dependent claims with the respective independent claim.

These and other aspects of the present invention will become apparent from and be elucidated with reference to the embodiments described hereinafter.

BRIEF DESCRIPTION OF THE DRAWINGS

Exemplary embodiments of the invention will be described in the following with reference to the accompanying drawing:
FIG. 1 shows schematically and exemplarily an embodiment of a substrate handling device for a wafer according to the invention.

DETAILED DESCRIPTION OF EMBODIMENTS

FIG. 1 shows schematically and exemplarily an embodiment of a substrate handling device 10 for a wafer according to the invention. The substrate handling device 10 is configured to handle a thin or ultra-thin substrate or a wafer (not shown), which might have a thickness of about 20 to 500 μm. Substrates with such a thickness are often very fragile, already initially bent and do not to have a planar surface.

The substrate handling device 10 comprises:
an end effector 11,
a straightening ring 12, and
a suction cup 13.

The end effector 11 comprise a plurality of suction cups 13 (only one is shown), which contact the substrate and utilize vacuum or reduced pressure to retain the substrate on the suction cup 13 or end effector 11.

The straightening ring 12 is more rigid than the suction cup 13, which is softer and more elastic than the straightening ring 12. The straightening ring 12 is releasably attached to the end effector 11. An outer circumference of the straightening ring 12 is larger than an outer circumference of the suction cup 13. This can be understood in that the straightening ring 12 radially extends over the suction cup 13.

The suction cup 13 is arranged within the straightening ring 12 and in a center of the straightening ring 12. The straightening ring 12 surrounds the suction cup 13 and thereby restricts the suction cup 13. It limits or prevents a radial deformation of the suction cup 13 and does not allow the suction cup 13 as gasket to deform in accordance with a given bending state of a thin substrate. As a result, the vacuum suction also does not get lost in case of thin and often non-planar substrates and such substrates are neither cracked nor lost.

A first part of the suction cup 13 is connected via an vacuum outlet 15 of the end effector 11 to a vacuum supply and a second part of the suction cup 13 is attachable to a substrate by means of reduced pressure provided by the vacuum supply. During operation of the substrate handling device 10, the vacuum supply is activated and the second part of the suction cup 13 is sucked to the substrate. In FIG. 1, the substrate would lie horizontally extending on top of the suction cup 13.

As shown, the suction cup 13 projects from the straightening ring 12 in a normal pressure state. In particular, a substrate-contacting surface 14 or an outer edge of the suction cup 13 axially projects from the straightening ring 12. It extends a certain distance further away from the end effector body compared to the straightening ring 12. The suction cup 13 would be on the same level as the straightening ring 12 in a reduced pressure state (not shown), in which the straightening ring 12 contacts the substrate, so that the substrate is held by the suction cup 13. The outer edge of the suction cup 13 would reach the same height as the straightening ring 12 and would thereby straighten a potentially bend substrate.

At the time the substrate should be released, the reduced pressure or vacuum would be turned off or gradually reduced. As a consequence, the suction cup 13 would elevate back to its initial position and again extend further away from the end effector body and the straightening ring 12. As a result, the substrate would be pushed away from the straightening ring and then released from the suction cup 13 at a predetermined moment.

The straightening ring 12 and the suction cup 13 are releasably, removably and exchangeable attached to the end effector 11. They can be exchanged or replaced by another straightening ring 12 or suction cup 13, which is newer or has other properties, shapes or sizes.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A substrate handling device for a wafer, comprising:
   an end effector,
   a straightening ring, and
   a suction cup,
   wherein the suction cup is arranged within the straightening ring,
   wherein a first part of the suction cup is connectable to a vacuum supply and a second part of the suction cup is attachable to a substrate by means of reduced pressure provided by the vacuum supply,
   wherein the suction cup projects from the straightening ring in a normal pressure state, and
   wherein the second part of the suction cup is on the same level as the straightening ring in a reduced pressure state, in which the substrate is directly contacted and held by the second part of the suction cup, so that the straightening ring also directly contacts the substrate,
   characterised in that the straightening ring is releasably attached to the end effector, and also the suction cup is releasably attached to the end effector, and the straitening ring is exchangeable with another straightening ring, wherein the another straightening ring has a different height than the straightening ring.

2. The substrate handling device according to claim 1, wherein the straightening ring surrounds the suction cup and restricts a radial deformation of the suction cup.

3. The substrate handling device according to claim 1, wherein the suction cup holds the substrate in the reduced pressure state in an essentially horizontal or an essentially vertical position relative to the ground.

4. The substrate handling device according to claim 1, wherein, when the straightening ring contacts the substrate and the substrate is non-planar, the straightening ring at least partially straightens the non-planar substrate.

5. The substrate handling device according to claim 1, wherein the suction cup projects with a distance d from the straightening ring in the normal pressure state, and wherein a distance d to size s of the substrate ratio is in the range between 30:1 and 800:1.

6. The substrate handling device according to claim 1, wherein an outer circumference of the straightening ring is larger than an outer circumference of the suction cup.

7. The substrate handling device according to claim 1, wherein a substrate-contacting surface of the suction cup projects from the straightening ring in the normal pressure state.

8. The substrate handling device according to claim 1, wherein the straightening ring is made of a material, which is more rigid than a cup material of the suction cup.

9. The substrate handling device according to claim 1, further comprising a plurality of suction cups.

10. The substrate handling device according to claim 1, further comprising a plurality of straightening rings, of which at least three straightening rings each surrounding one of the suction cups.

11. A substrate handling system for a wafer, comprising the substrate handling device according to claim 1.

12. The substrate handling system according to claim 11, further comprising at least a replacing straightening ring to replace the straightening ring of the substrate handling device.

13. A method for substrate handling, comprising the following steps:
   providing a suction cup arranged within a straightening ring,
wherein the straightening ring is releasably attached to an end effector, wherein a first part of the suction cup is connected to a vacuum supply and wherein the suction cup projects from the straightening ring in a normal pressure state,
   providing contact between a second part of the suction cup and a substrate, and
   providing a reduced pressure state by means of the vacuum supply so that the substrate is directly contacted and held by the second part of the suction cup,
   wherein the second part of the suction cup is in the reduced pressure state on the same level as the straightening ring, so that also the straightening ring directly contacts the substrate, wherein also the suction cup is-releasably attached to the end effector, and the straitening ring is exchangeable with another straightening ring, wherein the another straightening ring has a different height than the straightening ring.

14. The method according to claim 13, wherein the straightening ring contacts the substrate and, in case the substrate is non-planar, at least partially straightens the substrate in the reduced pressure state.

* * * * *